(12) United States Patent
Tiiliharju

(10) Patent No.: US 7,978,007 B2
(45) Date of Patent: Jul. 12, 2011

(54) FEEDBACK NETWORK FOR CASCADED AMPLIFIERS

(76) Inventor: Esa Tiiliharju, Helsinki (FI)

( * ) Notice: Subject to any disclaimer, the term of this patent is extended or adjusted under 35 U.S.C. 154(b) by 0 days.

(21) Appl. No.: 12/345,609

(22) Filed: Dec. 29, 2008

(65) Prior Publication Data

US 2010/0164618 A1 Jul. 1, 2010

(30) Foreign Application Priority Data

Dec. 28, 2007 (FI) .................................... 20071021

(51) Int. Cl.
H03F 1/24 (2006.01)
(52) U.S. Cl. .......................................... 330/98; 330/310
(58) Field of Classification Search .................. 330/98, 330/150, 310
See application file for complete search history.

(56) References Cited

U.S. PATENT DOCUMENTS

| | | | |
|---|---|---|---|
| 1,834,002 A | 12/1931 | Nyquist | |
| 3,918,005 A * | 11/1975 | Bruckenstein et al. | ......... 330/99 |
| 4,555,676 A * | 11/1985 | van de Plassche et al. | ... 330/298 |
| 5,264,806 A | 11/1993 | Kobayashi | |
| 5,371,479 A | 12/1994 | Hagerty | |
| 6,552,605 B1 * | 4/2003 | Yoon | .................. 330/9 |
| 6,801,087 B2 * | 10/2004 | Ausserlechner | .............. 330/255 |
| 7,045,762 B2 | 5/2006 | Fujita | |
| 2005/0023443 A1 | 2/2005 | Fujita | |

OTHER PUBLICATIONS

Article by Lorenzo Tripodi & Hans Brekelmans, "Low-noise variable-gain amplifier in 90-nm CMOS TV on mobile".
Article by Johan Janssens, Michiel Steyaert and Hiroyuki Miyakawa, "A 2.7 Volt CMOS Broadband Low Noise Amplifier", 1997 Symposium on VLSI Circuits Digest of Technical Papers.

* cited by examiner

Primary Examiner — Henry K Choe
(74) Attorney, Agent, or Firm — Stiennon & Stiennon

(57) ABSTRACT

The invention relates to a feedback network (60) for cascade amplifiers (200), which comprises an active stage (30) to feed signal back to a first internal node (65) at the output of the first amplifier stage (61) of the cascade. The invention further relates to a feedback network (60) which comprises said active feedback stage (30) with said first internal amplifier node (65) connection and a feedback resistor (10) connected from said cascade amplifier output port (out) to its input port (in).

16 Claims, 8 Drawing Sheets

FEEDBACK NETWORK FOR CASCADED AMPLIFIERS

CROSS REFERENCES TO RELATED APPLICATIONS

This application claims the benefit of priority of FI App. No. 20071021, filed on Dec. 28, 2007, the disclosure of which is incorporated by reference herein.

STATEMENT AS TO RIGHTS TO INVENTIONS MADE UNDER FEDERALLY SPONSORED RESEARCH AND DEVELOPMENT

Not applicable.

BACKGROUND OF THE INVENTION

The invention relates to a feedback network (60) for cascade amplifiers (200), which comprises an active stage (30) to feed signal back to a first internal node (65) at the output of the first amplifier stage (61) of the cascade. The invention further relates to a feedback network (60) which comprises said active feedback stage (30) with said first internal amplifier node (65) connection and a feedback resistor (10) connected from said cascade amplifier output port (out) to its input port (in).

The present invention relates to amplifiers in general, and to wideband feedback amplifiers operating at gigahertz frequencies in particular. The invention also relates to production of a broadband low-noise amplifier, that can be mass-produced at a negligible cost. This is a potentially important application for the invention, which is made more relevant by current interest in ultrawideband (UWB) communications for high bitrate consumer applications. Other possible applications include, but are not limited to, transimpedance amplifiers intended for optical communication systems. Thus, for economical reasons a bulk CMOS process mainly intended for integration of digital circuitry should be used for the purpose. Sufficient bandwidth with little gain variation could be guaranteed with three alternative techniques: 1) distributed amplification, 2) use of a complex filtering network at circuit input/output, or 3) feedback amplification. First choice is generally limited by its higher power dissipation and possibly intensive design effort, whereas the second choice includes an increased IC area, high design effort and resistive losses from parasitics. These considerations therefore suggest use of the third alternative, where a passive feedback network is used to swap amplifier gain for a wideband frequency response. Advantageously, this stabilizes gain and port impedances as well, and this 15 well-known technology is compatible with low-cost integration in complementary metal-oxide semiconductor (CMOS) processes.

However, the amount of applicable feedback is limited by stability considerations, and this has traditionally been dealt with by using different compensation networks which aim at increasing the amount of available stable feedback. Conventional microwave feedback designs use complex compensating capacitor networks for the purpose, but this approach is area-consuming, sensitive to parasitics, and timeconsuming to design. An example of a very complex feedback network is seen in FIG. 1 which duplicates the single-stage UWB low-noise amplifier (LNA) design reported in J.-H. C. Zhan and S. S. Taylor, "A 5 GHz resistive-feedback CMOS LNA for low-cost multi-standard applications," in Solid-State Circuits, 2006 IEEE International Conference Digest of Technical Papers, 2006, pp. 721-722, 730. 25 However, according to simulations this prior art work is impossible to reproduce with sufficient performance when using a modern nanometer level digital CMOS process with a standard low supply voltage, as its use of stacked transistors limits the available dynamic range (DR), and its complex feedback network requires an involved design effort. Fundamentally limiting is the low intrinsic gain of digital transistors, which decreases a single stage gain to an unacceptably low level.

A possible alternative which uses three cascaded gain stages is shown in FIG. 2 as reported in J. Janssens, M. Steyaert, and H. Miyakawa, "A 2.7 Volt CMOS broadband low noise amplifier," in VLSI Circuits, 1997. Digest of Technical Papers., 1997 Symposium on, 1997, pp. 87-88, where the main idea is to improve isolation of the circuit by driving a resistive feedback network with a gain stage. The circuit in FIG. 2 is in fact a variation of a well-known bipolar amplifier connection where an emitter-follower is used to drive the feedback resistors connected to the input port. However, although the depicted connection is simple on the surface, its use for e.g. UWB applications is problematic as the feedback amplifier gain roll-off introduces difficult high frequency poles to the feedback circuit. As a testimony to this the original circuit shown in FIG. 2 uses two additional impedance networks to compensate for parasitic effects: first inductor 032 and its dc-block 034 are used to null parasitics, second, the resistor-capacitor (RC) network 031, 033 has to be used to ensure stability.

SUMMARY OF THE INVENTION

In accordance with the teachings of the present invention, the amount of available stable feedback is increased by using an active stage to feed output signaling back to a first internal node at the output of the first amplifier stage of the cascade as shown in FIG. 3. In its most advantageous form, but not limited to, a copy of the last amplifier stage, or part thereof, is used as the proposed active feedback stage as this allows accurate setting of the amount of feedback used by simple scaling of said feedback stage. Thus, said dc-connected active feedback stage accurately mirrors a scaled copy of output stage biasing and signaling currents as feedback signaling. The proposed use of a copy of the last amplifier stage is the key behind increased amount of stable feedback available, as this inherently realizes frequency compensation by duplicating single amplifier pole and zero locations. Thus the well-known stability condition (A. S. Sedra and K. C. Smith, Microelectronic Circuits, th ed. Oxford University Press, 2003) of maintaining a minimum of 20-dB difference between the amplifier and feedback frequency response curves is naturally easier to maintain. This preferred embodiment also avoids prior art problem of loading the amplifier input port with feedback amplifier poles and zeros, and the designer can opt for the added flexibility of two feedback paths by realizing part of the desired feedback with a feedback resistor connected between the cascade amplifier input and output ports as shown in FIG. 4. Isolation is also increased and noise slightly decreased, since feedback resistor values can be made larger or practically infinite for the same amount of feedback. This is a direct consequence of the smaller amount of feedback which has to be realized resistively for a given desired amount of feedback.

BRIEF DESCRIPTION OF THE DRAWINGS

Further objects, features and advantages of the invention will become apparent from the following detailed description taken in conjunction with the accompanying figures showing a preferred embodiment of the invention.

DESCRIPTION OF THE PREFERRED EMBODIMENTS

Figure 1:
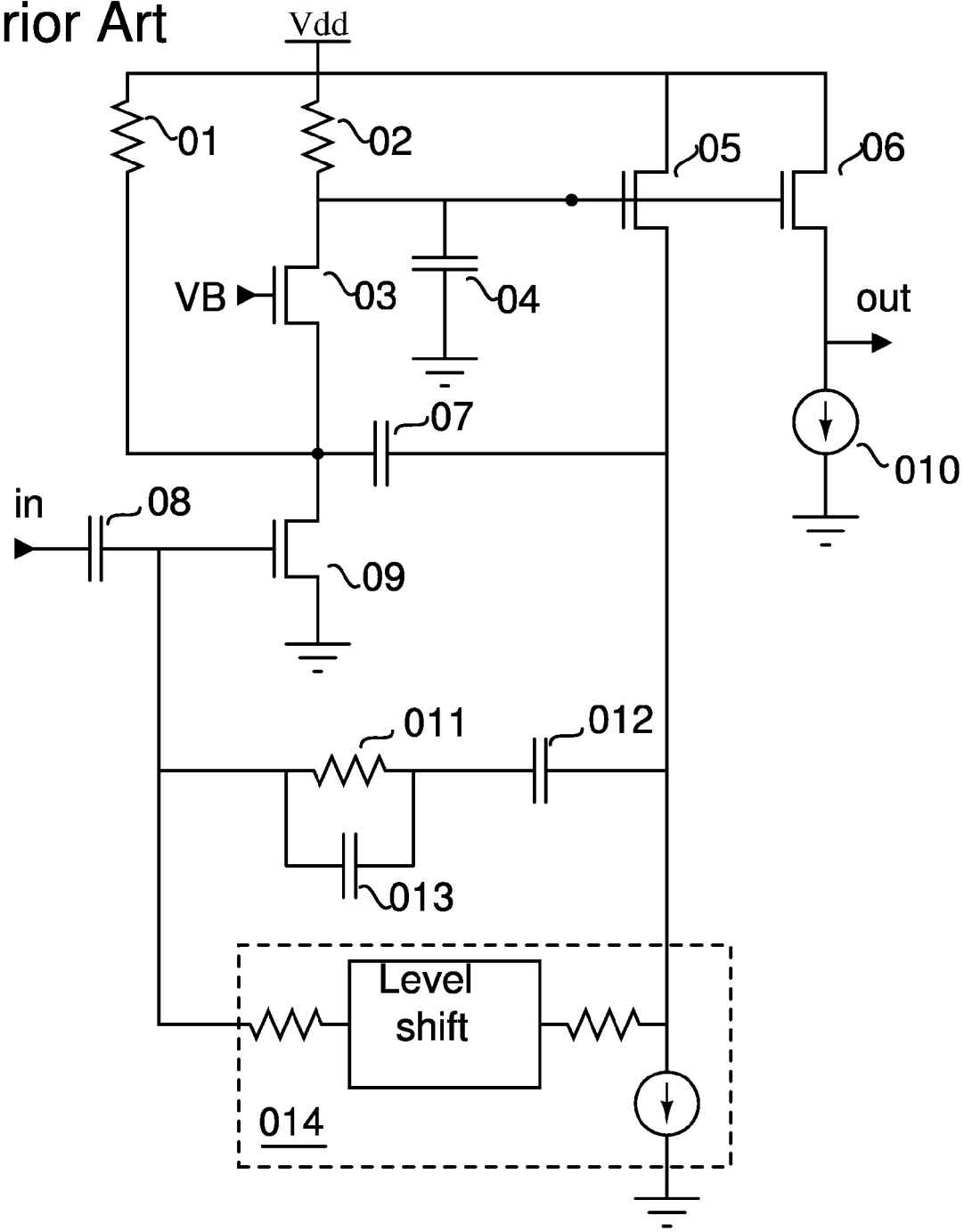
FIG. 1 shows a prior art CMOS LNA with a complex passive feedback network.
Figure 2:
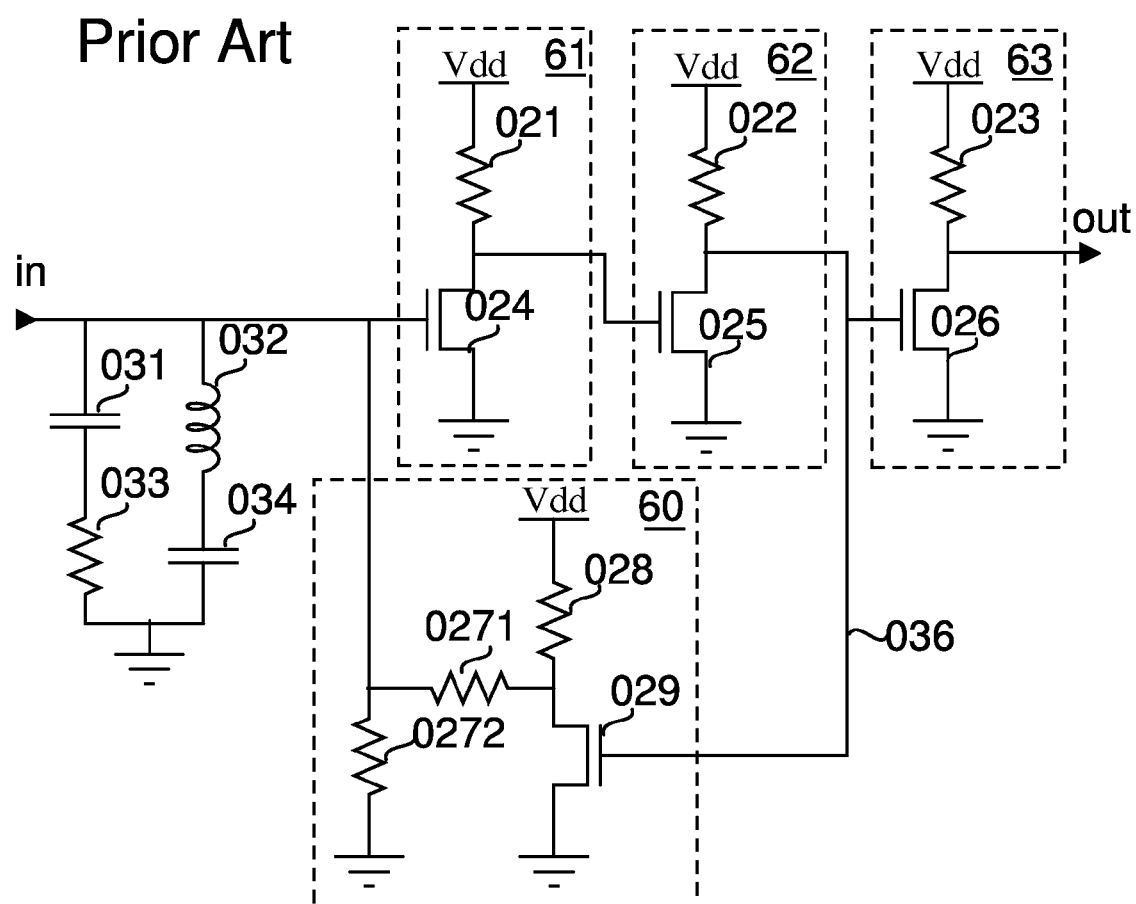
FIG. 2 shows a prior art cascade CMOS LNA with an amplifier driven resistive feedback network.

All figures use like reference designators for corresponding elements with similar function and purpose. FIG. 1 and FIG. 2 were discussed above in connection with the description of the prior art.

Throughout the figures, the same reference numerals and characters, unless otherwise stated, are used to denote like features, elements, components or portions of the illustrated embodiment. Moreover, while the subject invention will now be described in detail with reference to the figures, it is done so in connection with a preferred embodiment. It is intended that changes and modifications can be made to the described embodiment without departing from the true scope and spirit of the subject invention.

Figure 3:
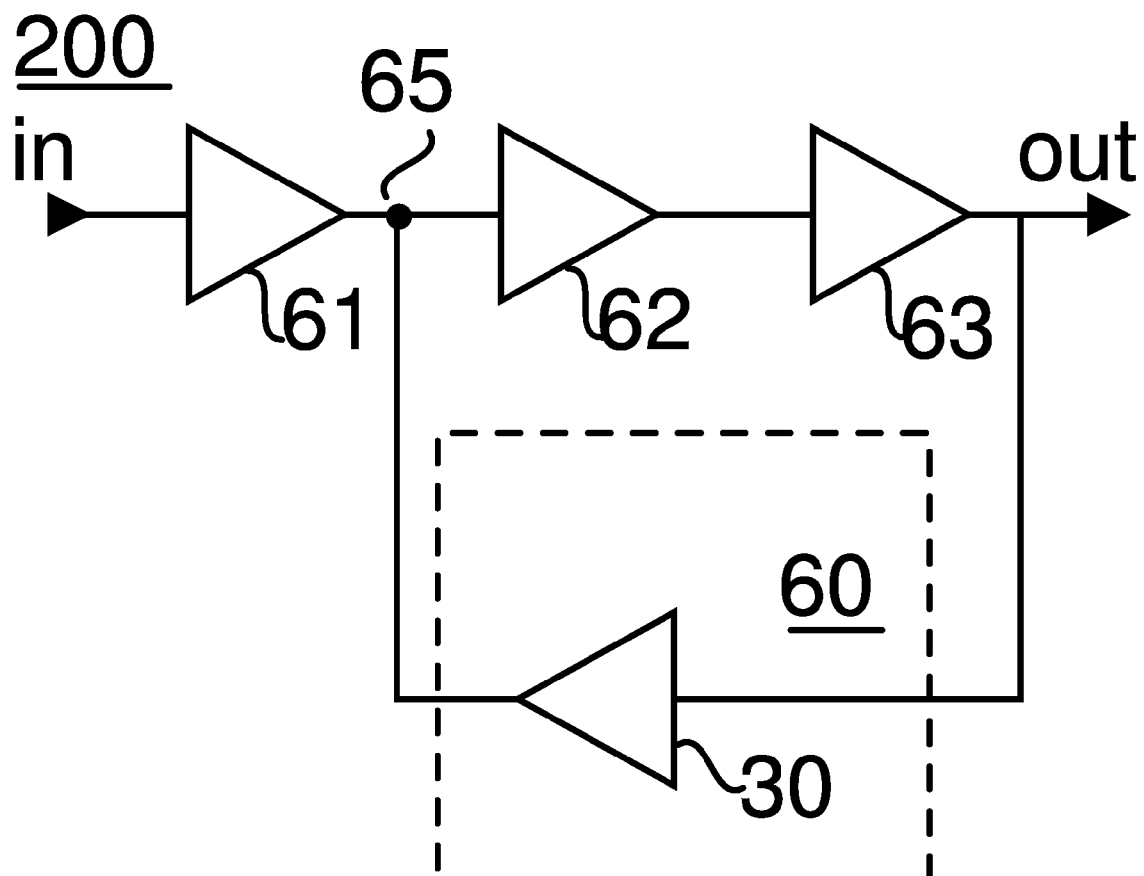
FIG. 3 shows a first application of the proposed feedback network to a cascade of three amplifier stages.

FIG. 3 depicts first application of the proposed feedback network to form a wideband cascade amplifier 200 wherein first amplifier 61 inputs signal to the circuit, which is further amplified by the second amplifier 62 and fed to the output port of the circuit by the third amplifier 63. Finally, the amplified signal is fed back from the output port to the circuit first internal node 65 through a feedback network 60 as proposed by the invention. The feedback network 60 consists of a properly dimensioned active stage which is preferably a scaled-down copy 30 of the third amplifying stage 63, or part thereof.

Figure 4:
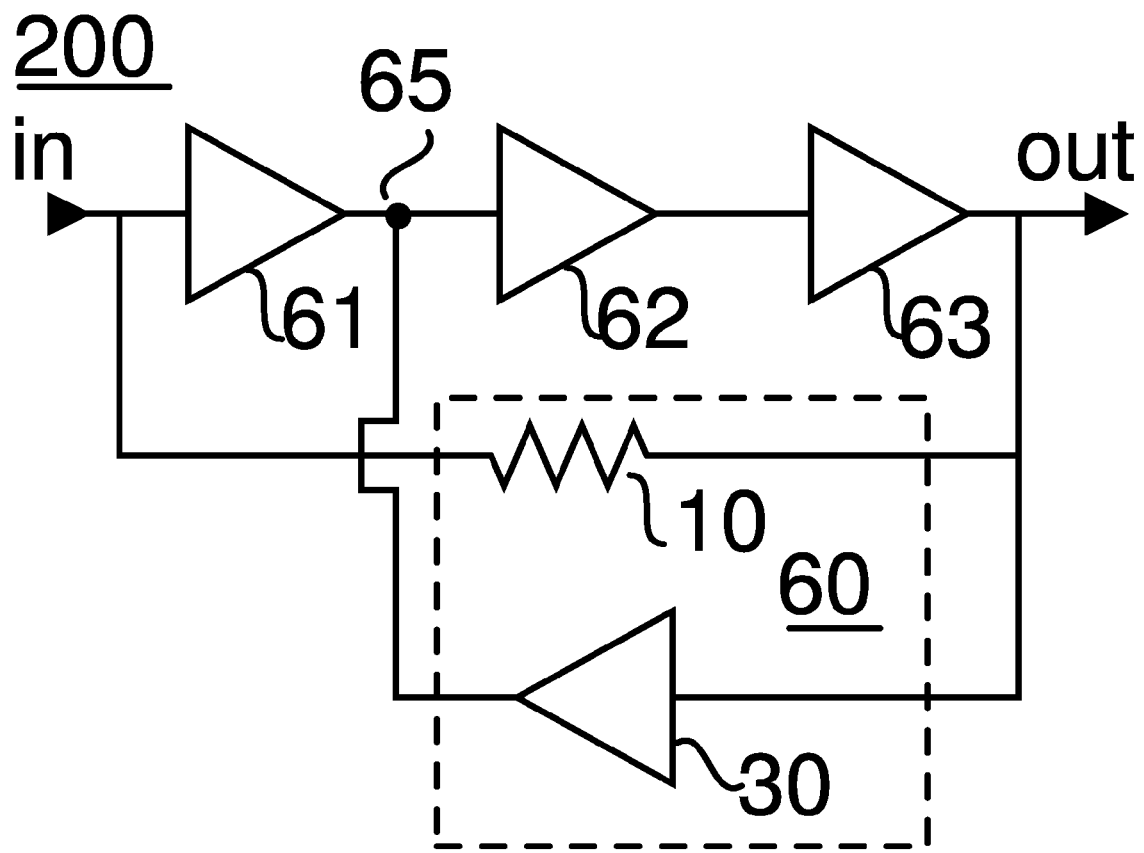
FIG. 4 shows another application of the proposed feedback network to a cascade of three amplifier stages.

FIG. 4 depicts another application of the proposed feedback network to form a wideband cascade amplifier 200 wherein first amplifier 61 inputs signal to the circuit, which is further amplified by the second amplifier 62 and fed to the output port of the circuit by the third amplifier 63. Finally, the amplified signal is fed back from the output port to the circuit first internal node 65 and to its input port through a feedback network 60 as proposed by the invention. The feedback network 60 consists of a properly dimensioned active stage which is preferably a scaled-down copy 30 of the third amplifying stage 63, or part thereof, and of a single resistor circuit 10.

Figure 5:
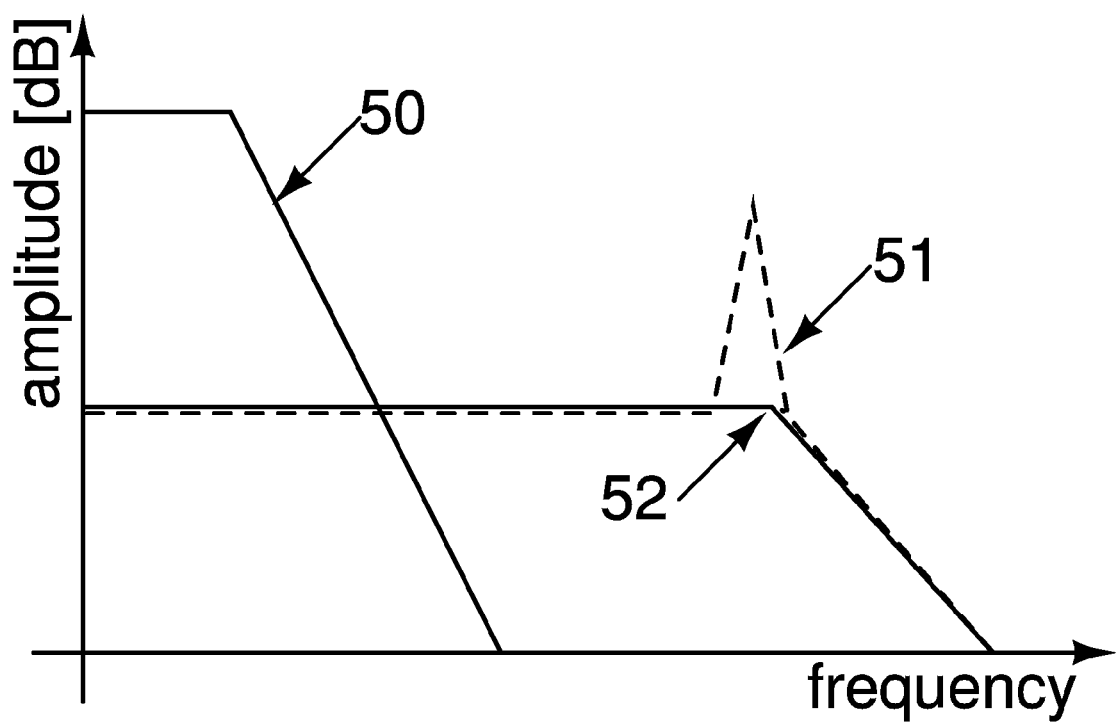
FIG. 5 illustrates the stabilizing effect that the use of the proposed feedback network technique has on an ultra wideband (UWB) low-noise amplifier (LNA) frequency response.

Benefits of the proposed feedback technology are evident from the frequency response diagram shown in FIG. 5 wherein graph 50 depicts amplifier response without feedback, and graphs 51 and 52 depict two different frequency responses for the same amount of feedback. The curve 51 depicted for the prior art resistor-only feedback network shows a clear amplitude peak, which is a sign for difficult time-domain settling behavior and possible oscillations. In contrast, the curve 52 depicted for the proposed technology is much flatter indicating good time-domain settling behavior and stability. Isolation between the ports is also increased as the circuit feedback resistor value can now be made higher for the same amount of feedback.

Figure 6:
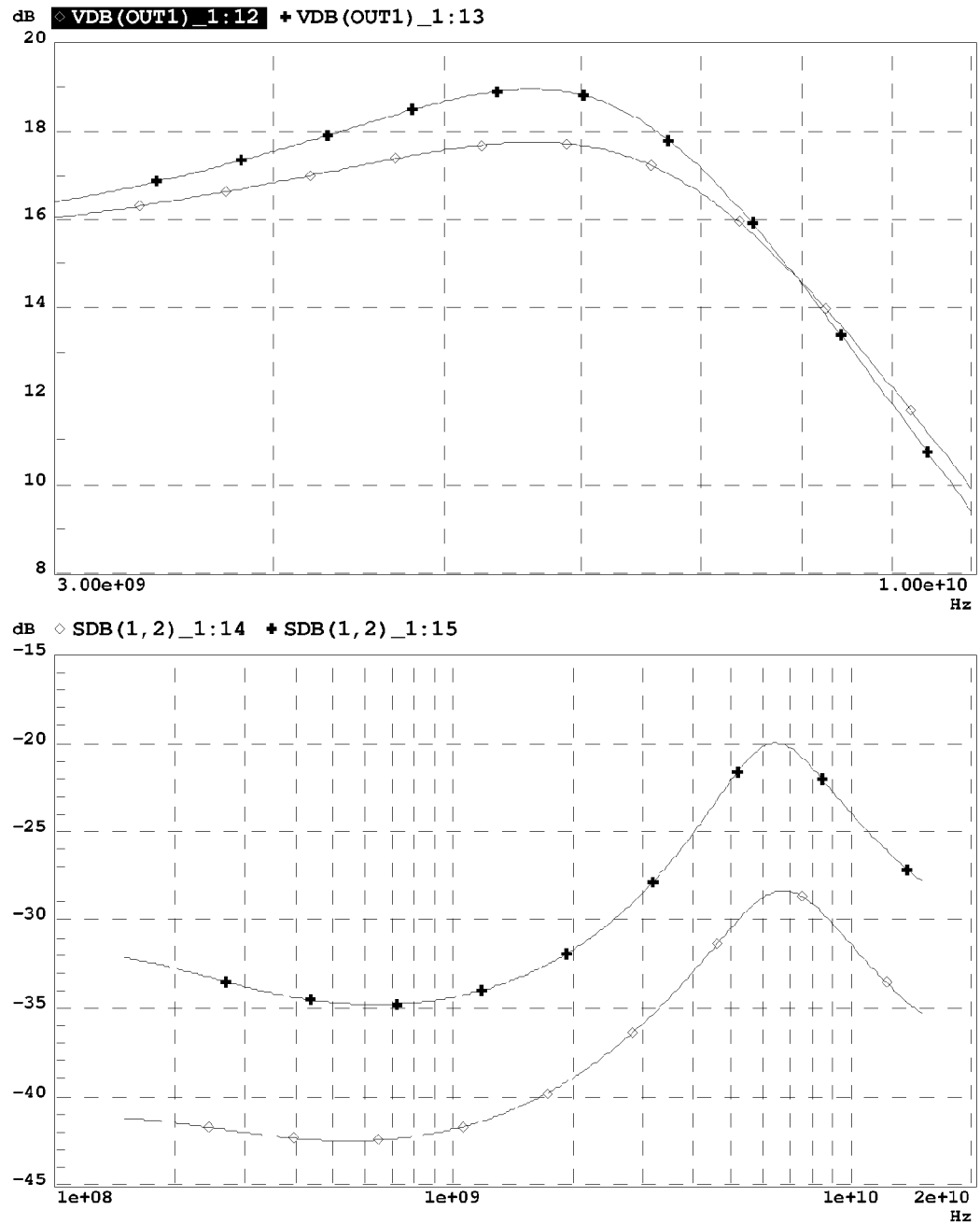
FIG. 6 compares simulated voltage gain (upper) and two-port isolation parameters S12 for both the proposed feedback network technique and for traditional resistor only circuit.

FIG. 6 compares simulation results for two feedback amplifiers which trade gain from identical similarly biased core amplifiers for extended bandwidths at ca. 9 GHz with equal remaining 15-dB midband/dc-gains. Thus both amplifiers use a similar amount of feedback with the results simulated for the present invention ticked with ◇. Results simulated for the prior-art resistive-only feedback amplifier have been ticked with +, respectively.

Upper sub-picture of FIG. 6 compares voltage gain peaking near amplifier 3-dB points, where application of the present invention is shown to reduce peaking noticeably for this 15-dB amplifier example. To put this result in perspective two things will be disclosed: 1) with different element values of the feedback network the improvement obtainable can be increased to ca. 3 dB for this 15-dB amplifier example; and 2) when feedback is increased to produce over 10-GHz bandwidths at 13-dB midband voltage gains, simulation results for the prior-art feedback amplifier indicate instable behavior whereas the proposed circuit maintains stability. Lower sub-picture of FIG. 6 compares simulated two-port isolation parameters S12 for the implemented 15-dB amplifiers with a clear 7-dB improvement indicated for the proposed feedback network technology.

Figure 7:
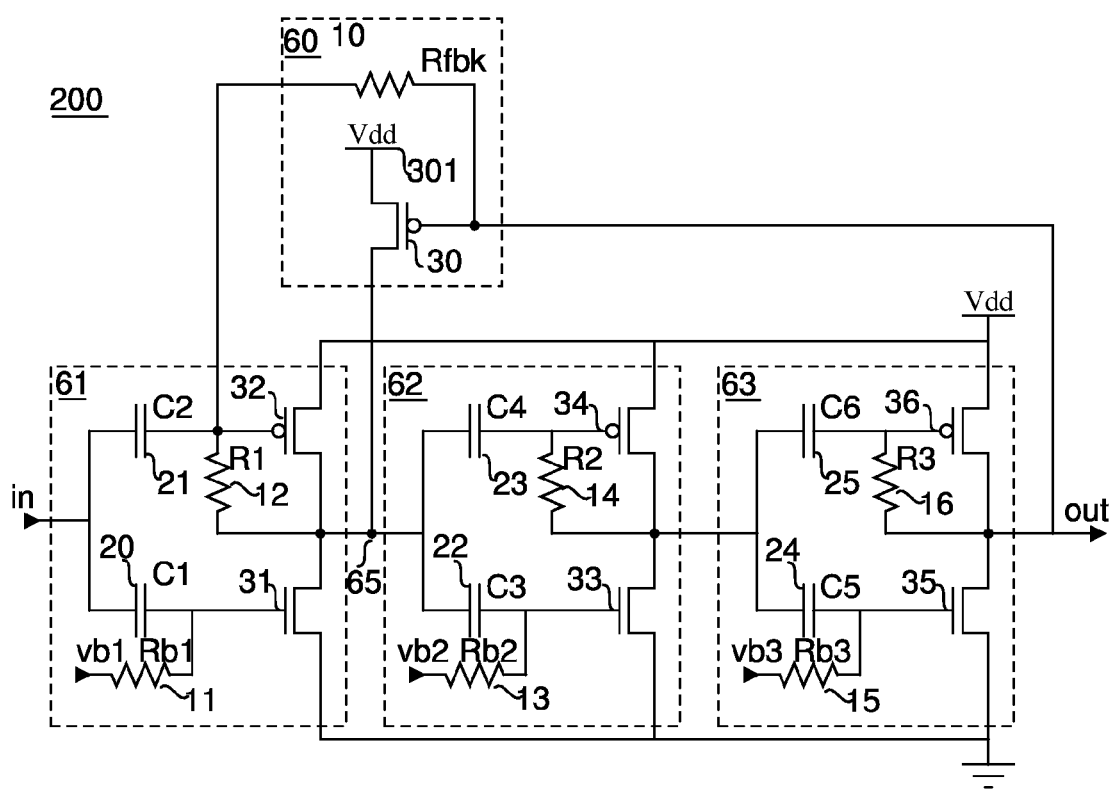
FIG. 7 shows one possible transistor level realization of the application of the proposed feedback network to a cascade of three amplifier stages shown in FIG. 4.

FIG. 7 shows one preferred embodiment of the wideband cascade amplifier 200 implementation wherein feedback network 60 has been arranged according to the teachings of the present invention to trade signal gain arising from the three amplifying stages 61, 62, 63 to a wideband frequency response. It should be noted, however, that the invention is not limited by inclusion of this example, as any practicing engineer easily designs variants thereof which are within the spirit and the scope as defined in this application.

First amplifier 61 includes a first NMOS input transistor 31, which has its source terminal connected to ground potential, and its gate terminal connected to dc-blocking capacitor 20 with value C1 and to biasing resistor 11 with value Rb1. Other end of the capacitor 20 is tied to signal input port in whereas other end of the biasing resistor 11 is connected to a biasing voltage vb1 which can be created in any way known in the art. It should be noted that use of this well-known biasing arrangement does not preclude use of self-biased amplifiers in this or later realizations. The NMOS input transistor drain terminal is connected to resistor 12 with value R1, to PMOS transistor 32 drain terminal, and to the first internal node 65 which is further connected to the input of the second amplifier 62. PMOS transistor 32 gate terminal is connected to dc-blocking capacitor 21 with value C2 and to biasing resistor 12 with value RI. Other end of the capacitor 21 is connected to stage input port, which it shares together with capacitor 20. PMOS transistor source terminal is further connected to a positive supply line 301 (labeled also with Vdd), and this completes description of the complementary transistor pair 31, 32 connection as a current-reuse amplifying stage to improve signal-to-noise ratio. It should be clear that although the current-reuse is a well-known technique in the art, its application is not a limitation of the proposed invention which relates to a novel arrangement of the feedback circuit.

After the first amplifier 61, the amplified signal is further amplified by the second amplifier 62 which in this preferred embodiment is schematically identical to the first amplifier to decrease design time and to utilize current-reuse. The second amplifier 62 includes a first NMOS input transistor 33, which has its source terminal connected to ground potential, and its gate terminal connected to dc-blocking capacitor 22 with value C3 and to biasing resistor 13 with value Rb2. Other end of the capacitor 22 is connected to second stage input port whereas other end of the biasing resistor 13 is connected to a biasing voltage vb2 which can be created in any way known in the art. The NMOS input transistor drain terminal is connected to resistor 14 with value R2, to PMOS transistor 34 drain terminal, and to the input of the third amplifier 63, respectively. PMOS transistor 34 gate terminal is connected to dc-blocking capacitor 23 with value C4 and to biasing resistor 14 with value R2. Other end of the capacitor 23 is connected to stage input port, which it shares together with capacitor 22. PMOS transistor source terminal is further connected to said positive supply line 301 labeled with Vdd.

After the second amplifier 62, the amplified signal is further amplified by third amplifier 63 which in this preferred embodiment is schematically identical to the first amplifier to decrease design time and to utilize current-reuse. The third amplifier 63 includes a first NMOS input transistor 35, which has its source terminal connected to ground potential, and its gate terminal connected to dc-blocking capacitor 24 with value C5 and to biasing resistor 15 with value Rb3. Other end of the capacitor 24 is connected to stage input port, whereas other end of the biasing resistor 15 is connected to a biasing voltage vb3 which can be created in any way known in the art. The NMOS input transistor drain terminal is connected to resistor 16 with value R3, to PMOS transistor 36 drain terminal, and to amplifier 200 output port labeled out. PMOS transistor 36 gate terminal is connected to dc-blocking capacitor 25 with value C6 and to biasing resistor 16 with value R3. Other end of the capacitor 25 is connected to stage input port, which it shares together with capacitor 24. PMOS transistor source terminal is further connected to positive supply line 301.

To trade gain available from the cascaded amplifying stages 61, 62, 63 for an (ultra) wideband frequency response, the amplified signal is fed back from the output port to the first internal node 65 and to the circuit input port through feedback network 60 built according to the teachings of the present invention. The feedback network 60 consists of a copy 30 of the output amplifying stage 63, or part thereof, and of a single resistor 10 with value Rfbk. In the preferred embodiment copy of the output amplifying stage 63 is a single PMOS transistor 30, but its operating point is well-controlled by choosing its width as a fraction of the output stage 63 PMOS transistor 36 width. This way a well-defined fraction of the output signaling current is copied back to the first internal node 65. Depending on application, all of the desired feedback could be implemented with device 30, but in the preferred embodiment resistor 10 has been used so as to: a) improve matching of the input port to 50Ω, and b) to give the designer another degree of freedom in designing a stable feedback without compensating networks.

Figure 8:
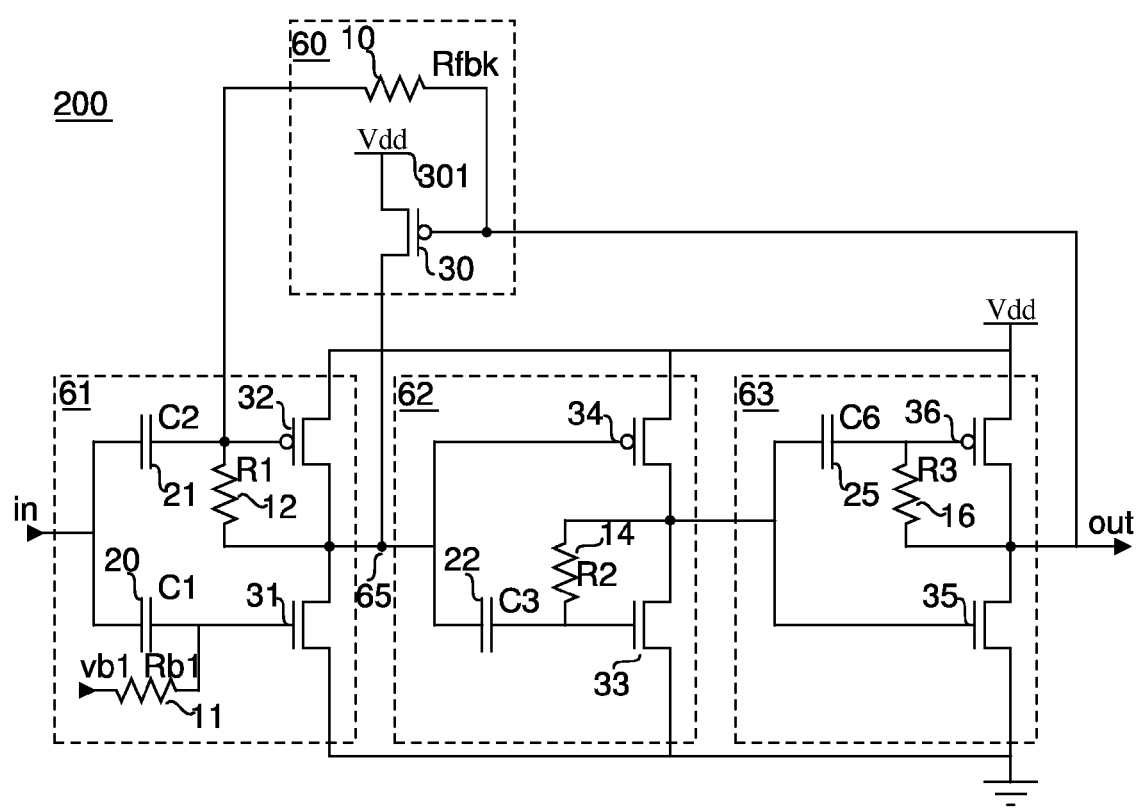
FIG. 8 shows another possible transistor level realization of the application of the proposed feedback network to a cascade of three amplifier stages shown in FIG. 4.

FIG. 8 shows another preferred embodiment of the wideband cascade amplifier 200 implementation wherein feedback network 60 has been arranged according to the teachings of the present invention to trade signal gain arising from the three amplifying stages 61, 62, 63 to a wideband behavior. In this preferred embodiment direct connection between the stages propagates bias generated for the first stage to the second and the third amplifying stages. This results in a frugal implementation which saves generation of two biasing voltages, two dc-block capacitors (and their parasitics), and two resistors.

First amplifier 61 includes a first NMOS input transistor 31, which has its source terminal connected to ground potential, and its gate terminal connected to dc-blocking capacitor 20 with value CI and to biasing resistor 11 with value Rb 1. Other end of the capacitor 20 is tied to signal input port in whereas other end of the biasing resistor 11 is connected to a biasing voltage vb1 which can be created in any way known in the art. The NMOS input transistor drain terminal is connected to resistor 12 with value R1, to PMOS transistor 32 drain terminal, and to the first internal node 65 which is further connected to the input of the second amplifier 62. PMOS transistor 32 gate terminal is connected to dc-blocking capacitor 21 with value C2 and to biasing resistor 12 with value R1. Other end of the capacitor 21 is connected to stage input port in, which it shares together with capacitor 20. PMOS transistor source terminal is further connected to a positive supply line 301 (labeled also with Vdd), and this completes description of the complementary transistor pair 31, 32 connection as a current-reuse amplifying stage to improve signal-to-noise ratio. It should be clear that although the current-reuse is a well-known technique in the art, its application is not a limitation of the proposed invention which relates to a novel arrangement of the feedback circuit.

After the first amplifier 61, the amplified signal is further amplified by the second amplifier 62, which in this preferred embodiment is schematically almost identical to the first amplifier to decrease design time and to utilize current-reuse. The second amplifier 62 includes a first NMOS input transistor 33, which has its source terminal connected to ground potential, and its gate terminal connected to dc-blocking capacitor 22 with value C3 and to biasing feedback resistor 14 with value R2. Other end of the capacitor 22 is connected to stage input port whereas other end of resistor 14 is connected to NMOS drain terminal to complete local feedback loop and to bias the transistor properly. The NMOS input transistor drain terminal is further connected to PMOS transistor 34 drain terminal, and to the input of the third amplifier 63, respectively. PMOS transistor 34 gate terminal is directly connected (dc-connected) to said first internal node 65 which is further connected to the first stage 61 output, and its source terminal is connected to the positive supply line 301 labeled with Vdd. Second stage biasing point is thus well-defined, as said PMOS gate dc-connection accurately mirrors first stage 61 biasing point brought to said first stage output by previously described first stage PMOS transistor local feedback resistor 12.

After the second amplifier 62, the amplified signal is further amplified by third amplifier 63 which in this preferred embodiment is schematically almost identical to the first amplifier to decrease design time and to utilize current-reuse. The third amplifier 63 includes a first NMOS input transistor 35, which has its source terminal connected to ground potential, and its gate terminal dc-connected to second stage 62 output. Third stage biasing point is thus well-defined, as said NMOS gate dc-connection accurately mirrors second stage 62 biasing point brought to said second stage output by previously described second stage NMOS transistor 33 local feedback biasing resistor 14. The NMOS input transistor drain terminal is connected to resistor 16 with value R3, to PMOS transistor 36 drain terminal, and to amplifier 200 output port labeled out, respectively. PMOS transistor 36 gate terminal is connected to dc-blocking capacitor 25 with value C6 and to said resistor 16 to complete local feedback loop biasing of said PMOS transistor. Other end of the capacitor 25 is connected to stage input port, which it shares together with NMOS transistor 35 gate. PMOS transistor source terminal is further connected to positive supply line 301.

To trade gain available from the cascaded amplifying stages 61, 62, 63 for an (ultra) wideband frequency response, the amplified signal is fed back from the output port to the first internal node 65 and to the circuit input port through a feedback network 60 built according to the teachings of the present invention. The feedback network 60 consists of a copy 30 of the output amplifying stage 63, or part thereof, and of a single resistor 10 with value Rfbk. In the preferred embodiment copy of the output amplifying stage 63 is a single PMOS transistor 30, but its operating point is well-controlled by choosing its width as a fraction of the output stage 63 PMOS transistor 36 width. This way a well-defined fraction of the output signaling current is copied back to the first internal node 65. Depending on application, all of the desired feedback could be implemented with device 30, but in the preferred embodiment resistor 10 has been used so as to: a) improve matching of the input port to 50Ω, and b) to give the designer another degree of freedom in designing a stable feedback without compensating networks.

The foregoing material is given to illustrate the present invention. It is thus apparent that those skilled in the art will be able to devise various arrangements which, although not explicitly described or shown herein, embody the principles of the invention and are thus within its spirit and scope.

For example, the invention is not limited by the use of the three stage cascade amplifier 200 example, but rather a cascade of two or more active stages can be within the spirit and scope of this invention. Further variants include, but are not limited to, use of said active feedback stage 30 with a dc-block inserted between its input and amplifier 200 output; connection of said feedback stage 30 to said first internal node 65 through an impedance network; realization of said optional feedback network resistor 10 with an N- or PMOS transistor, or with several transistors; realization of said optional feedback network resistor 10 as a variable valued resistor device; and realization of said optional feedback network resistor 10 as an impedance comprising of capacitor, resistor, and/or inductor realizations.

All described implementations of the proposed feedback network 60 can be easily varied by anyone skilled in the art to suit different applications, but the produced connection still remains within the spirit and scope of the proposed invention. Such variants include, but are not limited to, realization of all or part of the circuit blocks (60, 61, 62, 63) as complementary circuits in the sense that N- and PMOS transistor roles and connections have been interchanged. Further, although fully monolithic implementation is preferred, said cascade amplifier 200 input could be varied by realizing one or both of the dc-blocking capacitors (20, 21) as external, off-chip, capacitors. This kind of an implementation might be needed, e.g., to eliminate excess noise arising from parasitic resistors of said integrated capacitors or to limit IC area. For further improvement, said cascade amplifier 200 could be preceded by an inductive impedance element to improve its impedance matching and possibly noise properties.

Variants fitting within the scope and spirit of the described invention also include cascading of multiple copies of the cascade amplifier 200 built according to the teachings of the invention, or parallel connection of two or more of said amplifiers to output to two or more output ports. Latter case is easily adapted to be used for differential amplification where one of the parallel amplifiers outputs to an in-phase output port while the other one outputs to an out-of-phase output port. Differential input signaling can be arranged with well-known techniques such as minoring, use of external baluns etc.

It should be stated that the given variants do not limit the scope of the proposed invention, as it is easy for a person skilled in the art to devise a further multitude of variants which still fall within the spirit and scope of the proposed invention.

It will become apparent to those skilled in the art that many changes, modifications, variations, and other uses and applications of the subject invention are possible and contemplated. It should be understood that the invention has application far beyond the exemplary embodiments presented and described herein, and as such is not to be limited to those embodiments. In addition, the invention is not limited to the particularly physical configuration, but instead is adaptable. All changes, modifications, variations, and other uses and applications which do not depart from the spirit and scope of the invention are deemed to be covered by the invention.

The invention claimed is:

1. A feedback network (60) for a multistage amplifier, comprising:
    two or more amplifier stages connected in cascade;
    wherein a feedback amplifier stage (30) is connected from circuit output to its first internal node (65) at the output of the first amplifier stage (61) of the cascade;
    wherein said feedback network (60) comprises a feedback resistor (10) connected from cascade amplifier output port to said cascade amplifier input port, and a feedback amplifier stage (30) connected from circuit output to its first internal node (6) at the output of the first amplifier stage of the cascade (61);
    further comprising a feedback resistor (10) connected from the cascade amplifier output port to said amplifier input port, and a feedback amplifier stage (30) connected from said amplifier output to its first internal node (6) at the output 3 of the first amplifier stage of the cascade (61), characterized in that said feedback amplifier stage (30) comprises a PMOS transistor which mirrors output stage signaling and biasing current as a feedback signal through sensing it with its gate node and is delivering its feedback signaling through its drain node directly connected to said first internal node (6); said cascade amplifier comprises three copies of schematically similar biased CMOS amplifier stages (61, 62, 63) which can have different element values each according to desired performance; and wherein said schematically similar biased CMOS amplifier stages have a first NMOS input transistor which is loaded with a PMOS input transistor so as to form current reuse amplifying stages.

2. A feedback network (60) for a multistage amplifier, where the amplifier consists of two or more amplifier stages connected in cascade, characterized in that a feedback amplifier stage (30) is connected from circuit output to its first internal node (65) at the output of the first amplifier stage (61) of the cascade;
    wherein said feedback network (60) comprises a feedback resistor (10) connected from the cascade amplifier output port to said cascade amplifier input port, and a feedback amplifier stage (30) connected from circuit output to its first internal node (6) at the output of the first amplifier stage of the cascade (61);
    wherein said cascade amplifying stages (61, 62, 63) are dc-connected to mirror first stage biasing and signaling current so that the arrangement is characterized in that said cascade second amplifying stage (62) is dc-connected at its PMOS transistor (34) input gate so that its NMOS input transistor (33) load is biased and linearized with a local feedback resistor (14); said second stage NMOS input transistor (33) gate is driven with input signaling through a dc-blocking capacitor (22); said cascade third amplifying stage (63) is dc-connected at its NMOS transistor (3) input gate so that its PMOS input transistor (36) load is biased and linearized with a local feedback resistor (16); and said third stage PMOS input transistor (36) gate is driven with input signaling through a dc-blocking capacitor (25).

3. The feedback network according to claim 1 or 2 characterized in that said feedback amplifier stage (30) is dc-connected to said cascade amplifier output port.

4. The feedback network according to claim 1 or 2 wherein said feedback amplifier stage (30) is characterized in that its output is connected to said first internal node (6) of the cascade amplifier (200) through an impedance network.

5. The feedback network according to claim 1 or 2 characterized in that said feedback network resistor (10) has been realized with N- or PMOS transistor and/or transistors.

6. The feedback network according to claim 1 or 2 characterized in that said feedback network resistor (10) has been realized as a variable valued resistor.

7. The feedback network according to claim 1 or 2 characterized in that said feedback network resistor (10) has been realized as an impedance circuit comprising capacitor, resistor, and/or inductor realizations.

8. The feedback network according to claim 1 or 2 wherein all or part of the circuit blocks (60, 61, 62, 63) are complementary to said realizations in the sense that N- and PMOS transistor roles and connections have been interchanged.

9. The feedback network according to claim 1 or 2 wherein one or both of the integrated dc-blocking capacitors at the cascade amplifier (200) first amplifier stage (61) input have been implemented as external, off-chip, capacitors.

10. The feedback network according to claim 1 or 2 wherein the cascade amplifier (200) is preceded by an inductive impedance element.

11. The feedback network according to claim 1 or 2 wherein some or all of the amplifier stages are self-biased.

12. The feedback network according to claim 1 or 2 wherein multiple copies of the cascade amplifier (200) are cascaded to act as an amplifying stage.

13. The feedback network according to claim 1 or 2 wherein multiple copies of the cascade amplifier (200) are connected in parallel to output to multiple output ports.

14. The feedback network according to claim 1 or 2 wherein the feedback network is implemented in monolithic form.

15. The feedback network of claim 1 wherein said cascade amplifying stages (61, 62, 63) are dc-connected to mirror first stage biasing and signaling current so that the arrangement is characterized in that said cascade second amplifying stage (62) is dc-connected at its PMOS transistor (34) input gate so that its NMOS input transistor (33) load is biased and linearized with a local feedback resistor (14); said second stage NMOS input transistor (33) gate is driven with input signaling through a dc-blocking capacitor (22); said cascade third amplifying stage (63) is dc-connected at its NMOS transistor (3) input gate so that its PMOS input transistor (36) load is biased and linearized with a local feedback resistor (16); and said third stage PMOS input transistor (36) gate is driven with input signaling through a dc-blocking capacitor (2).

16. The feedback network according to claim 1 or 2 wherein the said feedback network is a CMOS transistor realization of said feedback network.

* * * * *

UNITED STATES PATENT AND TRADEMARK OFFICE
CERTIFICATE OF CORRECTION

PATENT NO.       : 7,978,007 B2
APPLICATION NO.  : 12/345609
DATED            : July 12, 2011
INVENTOR(S)      : Tiiliharju It is certified that error appears in the above-identified patent and that said Letters Patent is hereby corrected as shown below:

Column 8, line 2, "techniques such as minoring, use of external baluns etc." should be
-- techniques such as mirroring, use of external baluns etc. --

Signed and Sealed this
Twenty-ninth Day of May, 2012

David J. Kappos
*Director of the United States Patent and Trademark Office*